US005114086A

United States Patent [19]

Ho

[11] Patent Number: 5,114,086

[45] Date of Patent: May 19, 1992

[54] METHOD AND APPARATUS FOR WINDING A LUMPED ELEMENT DELAY LINE

[75] Inventor: Ronald Ho, Port Townsend, Wash.

[73] Assignee: Quantum Medical Systems, Inc., Issaquah, Wash.

[21] Appl. No.: 561,143

[22] Filed: Aug. 1, 1990

[51] Int. Cl.[5] ........................ H01F 15/10; H05K 7/02

[52] U.S. Cl. .................................. 242/7.03; 242/7.15; 29/564.4; 29/605

[58] Field of Search .............................. 29/605, 564.4; 242/7.02, 7.15, 7.06, 7.21, 7.03

[56] References Cited

U.S. PATENT DOCUMENTS 2,959,372 11/1960 Sadorf ................................ 242/7.15
2,964,252 12/1960 Rosenberg ......................... 242/7.15
4,759,120 7/1988 Bernstein ............................. 29/605
4,866,573 9/1989 Bernstein ............................. 29/605

*Primary Examiner*—Katherine Matecki
*Attorney, Agent, or Firm*—Lawrence C. Edelman

[57] ABSTRACT

An apparatus for continuously winding a plurality of inductors with insulated wire on an elongated bobbin in a manner such that portions of the wire that will locate at specified locations has its insulation is removed prior to wrapping. The apparatus includes a rotating device for turning the bobbin, a feedscrew for imparting a controlled pitch on the winding, a suspension system running the wire from a wire spool to the bobbin, and a means for removing insulation from the portions of the wire that will locate at the specified locations.

7 Claims, 3 Drawing Sheets

METHOD AND APPARATUS FOR WINDING A LUMPED ELEMENT DELAY LINE

TECHNICAL FIELD

This invention relates to electronic delay lines. More particularly, it relates to a method of winding lumped element delay line inductors so that reliable electrical interconnects can be obtained therewith.

BACKGROUND OF THE INVENTION

In many applications of ultrasound imaging controlled time delays of electronic signals are required. Many different methods of achieving time delays are possible, such as transmission lines, surface acoustical waves, and wave guides. However, one of the most common methods of achieving time delays is the use of lumped element delay lines. Lumped delay lines are comprised of discrete inductances and capacitances interconnected together in sections, such as the well-known T-section delay line.

Typically, a lumped element delay line is fabricated by first winding enamel coated wire on a bobbin with a given number of turns at a specified pitch (turns per inch), length-to-diameter ratio (L/D), and inductor-to-inductor spacings, and then connecting the delay line capacitors to the winding at specified locations. While lumped element delay lines have been highly successful, their previous manufacturing processes have had serious drawbacks. Specifically, since the delay line capacitors are connected to the winding only after the winding is completed, the enamel coating on the wire must be scraped away to allow an electrical connection with the capacitors. This scraping causes nicks and gouges on the underlying copper. Additionally, since the scraped area is usually tinned to facilitate the connection, insufficient scraping leads to poor tinning. Finally, the application of heat during tinning and soldering may cause the underlying bobbin to melt, thus adding contaminants to the solder joint. These effects all tend to reduce the resulting connection's reliability.

It is therefore clear that there has existed a need for a method of winding lumped element delay lines such that the delay line's inductors are wound continuously, but in a manner such that high reliability electrical connections with the winding is possible.

SUMMARY OF THE INVENTION

It is an object of the present invention to provide an apparatus and a process for continuously winding a plurality of inductors on an elongated bobbin such that at specified locations on the winding the insulation was removed from the wire prior to the winding.

To achieve the foregoing and other objects, an apparatus for continuously winding a plurality of inductors on an elongated bobbin includes a means for rotating the bobbin; a means for guiding the wire onto the bobbin with a controlled pitch; and a removing means for removing insulation from the wire after a predetermined length of the wire has passed through the removing means, the removing means being controlled so that the lengths of the wire without insulation overly the specified locations when the wire is wound on the bobbin.

To achieve the foregoing and other objects, the process includes removing the insulation from the wire at the proper locations so that as the wire portions without insulation are wrapped on the bobbin they locate at the specified locations.

In the preferred embodiment, because the bobbin used includes protrusions with axially aligned notches through which the wire portions without insulation are to lay, the apparatus further includes a means for threading the wire portions without insulation through the notches.

DETAILED DESCRIPTION OF THE INVENTION

Figure 1:
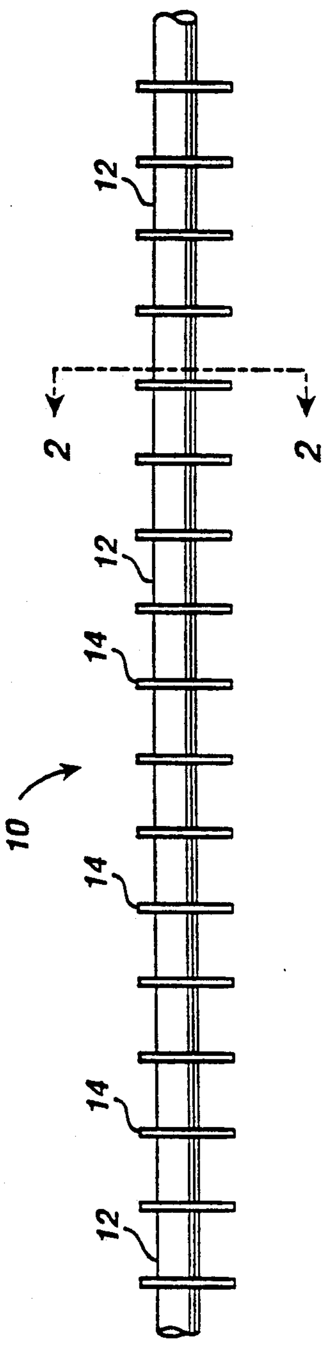
FIG. 1 is an elevational view showing a bobbin suitable for winding by an apparatus according to the preferred embodiment.
Figure 2:
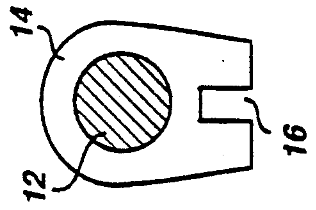
FIG. 2 is a cross-sectional view taken along the line 2—2 of FIG. 1 showing a cut-away view of a disk portion of the bobbin shown in FIG. 1.

In the preferred embodiment, inductors of a lumped element delay line are continuously wound with enamel coated wire on a delay line bobbin 10, shown in FIG. 1. The delay line bobbin 10 is constructed of a central core 12 upon which disks 14 are placed at selected locations. As shown in more detail in FIG. 2, each disk 14 has a notch 16. These notches 16 are aligned with each other so that they may receive the edge of a printed circuit board. Inserting the edge of a printed circuit board into the notches 16 facilitates mechanical and electrical connection between the bobbins 10 and the printed circuit board on which the delay line's capacitors are mounted. The delay line's inductors are electrically connected to capacitors via wires that pass through the notches 16 and are soldered to printed circuit board conductor patterns located where the printed circuit board is inserted into the notches 16. To enable a reliable electrical connection, the enamel insulation must be removed from the wire at the notches 16.

Figure 3:
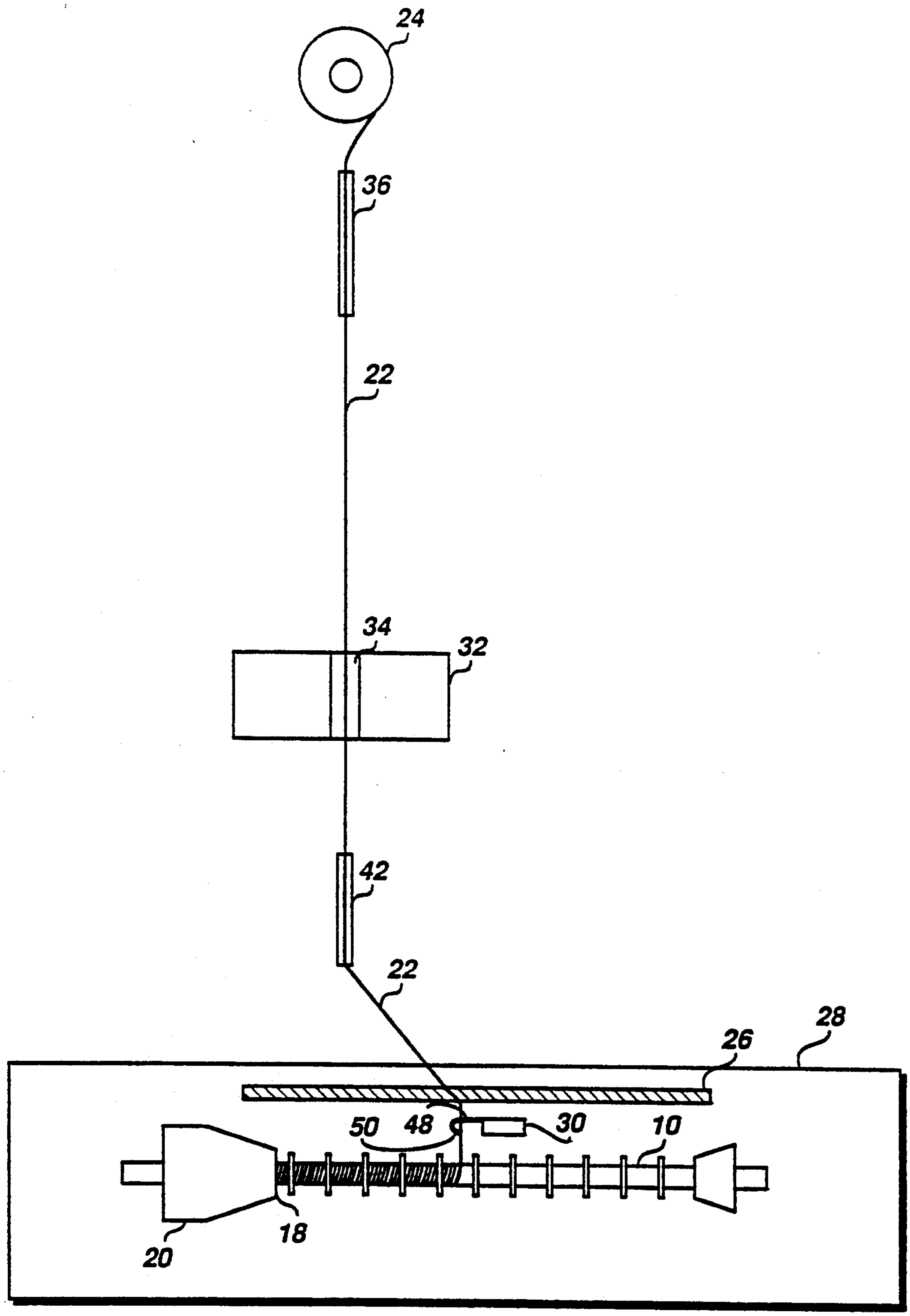
FIG. 3 is a top plan view showing the preferred embodiment of the invention.

Referring now to FIG. 3, the delay line bobbin 10 is inserted into the jaws 18 of a rotating device 20, such as a conventional motor. Enamel coated wire 22 from a spool 24 is wound on the delay line bobbin 10 after passing through a conventional feedscrew 26. The feedscrew 26, an externally threaded rod mechanically coupled to the rotating device 20, imparts a uniform feeding action on the wire 22, causing it to wind with a controlled pitch onto the delay line bobbin 10. The rotating device 20 and the feedscrew 26 are components of a winding machine 28, which also includes a finger 30 for threading the wire 22 through the notches 16. The finger 30 is discussed in more detail below.

Figure 4:
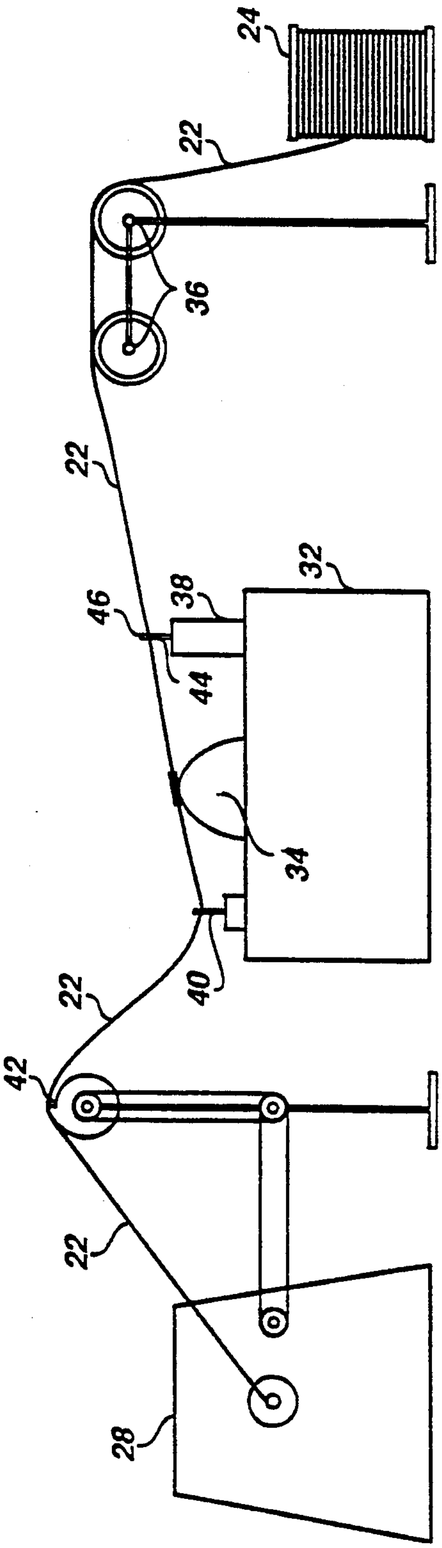
FIG. 4 is a side elevational view of the apparatus shown in FIG. 3.

Referring now to FIG. 4, a solder reservoir 32 is located between the spool 24 and the winding machine 28. The solder reservoir 32 contains heated solder 34, and includes a solenoid 38 for selectively displacing the wire 22 into heated solder 34. When the solenoid in unactuated, the wire 22 is positioned slightly above the heated solder 34. The solder reservoir 32 also includes wire guide 40 for guiding the wire 22 from the solder reservoir 32.

A wire de-reeler 36 guides the wire from the spool 24 to the solder reservoir 32. A cam 42 is positioned between the solder reservoir 32 and the winding machine 28. As explained below, the cam 42 maintains the length of the wire 22 constant between the heated solder 34 and the bobbin 10.

The routing of the wire 22 is such that the wire 22 leaves the spool 24, passes through the wire de-reeler 36, through the solenoid 38 close to the heated solder 34, through the wire guide 40, across the cam 42, and to the winding machine 28.

The wire de-reeler 36 keeps tension on the wire 22 as it is suspended between the spool 24 and the winding machine 28. The tension on the wire 22 must be sufficient to keep the wire relatively straight as it is routed from the spool to the winding machine 28 but not so great as to damage the wire. Additionally, the wire de-reeler 36 keeps the wire 22 from kinking as it leaves the spool 24.

As the delay line bobbin 10 rotates, wire is drawn from the spool 24. When a portion of the wire 22 that will thread through a notch 16 passes over the solder reservoir 32, the solenoid 38 is actuated forcing the wire 22 to enter the heated solder 34 in the solder reservoir 32.

The solenoid 38 has a moveable armature 44 that terminates in a hook 46, through which the wire 22 passes. The wire 22 is suspended in a relatively straight line that runs from the hook 46, close to the solder 34, then to the wire guide 40. When the solenoid 38 is actuated, the armature 44 moves downward, causing its hook 46 to contact the wire 22 and pull the wire into the solder 34.

The solder reservoir 32 is a wave soldering apparatus that induces the solder 34 to flow in a fixed "wave". The solder 34 is typically heated to approximately 750° F., which has been found sufficient to remove the enamel insulation from the wire 22. When the wire 22 is forced into the solder 34, the insulation is removed and the wire is tinned by the solder 34. The length of the wire that is tinned can be adjusted by setting how far the solenoid 38 pulls the wire 22 into the solder 34. In the preferred embodiment, the length of the tinned portion is somewhat longer then the width of the notches 16 to compensate for various factors, such as inaccuracies in the bobbin 10 and disks 14, stretching of the wire 22, and inaccuracies in the feedscrew 26.

With reference to FIGS. 3 and 4, the function of the cam 42 is to maintain the length of wire 22 constant between the wire guide 40 and the bobbin 10. It is important to maintain the length of wire 22 constant so that the solenoid 38 can be actuated at the proper time to place an area of the wire 22 in the heated solder 34 that will be positioned in a notch 16 when the wire 22 is subsequently wound on the bobbin 10. With reference to FIG. 3, it is apparent that the length of the wire 22 between the wire guide 40 and bobbin 10 will change as different portions of the bobbin 10 are wound. However, the cam 42 is mechanically coupled to the rotating device 20 so that it raises the wire 22 as the horizontal offset of the wire 22 between the wire guide 40 and finger 30 increases. As a result, the distance between the solder 34 and the notches 16 remains constant as the finger 30 moves horizontally.

The actuation of the solenoid 38 is timed to occur during a "dwell window" in the winding sequence. The dwell window is a time period during which the rotation of the delay line bobbin 10 is slowed so that the finger 30 of the winding machine 28 can thread the wire 22 though a notch 16. While the dwell window timing is not at all critical, it must last long enough for the finger 30 to thread the wire 22 and for the insulation on the wire 22 to be removed by the solder 34.

The finger 30 is a solenoid device having an armature 48 that terminates in a hook 50 through which the wire 22 passes. When actuated, the finger 30 pulls the armature inward, causing the hook 50 to contact the wire, threading it through the notch 16. The finger 30 is mechanically coupled to the feedscrew 26 so that it travels along the delay line bobbin 10 as the winding progresses. Operation of the finger 30 occurs when the winding on the delay line bobbin 10 approaches the disk 14, and when the wire 22 is axially aligned with the notches 16. Many methods of synchronizing operation can be implemented. However, in the preferred embodiment, because of the fixed outer diameter of the delay line bobbin 10, the constant winding pitch imparted by the feedscrew 26, and the use of the wire length compensating cam 42, the actuations of the finger 30 is a direct function of the rotation of the delay bobbin 10. Therefore, after a predetermined number of turns, the finger 30 is actuated.

The above-described detailed description of the preferred embodiment has indicated numerous characteristics of the present invention. However, the detailed description is illustrative only. Therefore, it is the intention of the inventor that his invention be protected to the full extent indicated by the appended claims.

What is claimed is:

1. An apparatus for continuously winding wire coated with an insulation from a spool onto an elongated bobbin having a plurality of longitudinally spaced disks; comprising:

winding means for rotating said bobbin;

guide means for guiding the wire onto said bobbin at a controlled pitch; and removing means through which said wire extends between said spool and said guide means, said removing means having actuating means for causing said removing means to remove said insulation from said wire so that lengths of said wire without insulation overlie respective disks when said wire is wound on said bobbin;

wherein said guide means includes means for moving said guide means along the length of said bobbin when said wire is being wound on said bobbin, thereby altering the length of wire extending between said removing means and said bobbin, and wherein said winding means further includes wire length compensating means for maintaining the length of wire between said removing means and said bobbin constant as said guide means moves along the length of said bobbin.

2. The winding apparatus of claim 1 wherein said wire length compensator means includes a mechanical actuator positioned between said removing means and said guide means, said mechanical actuator displacing said wire in a direction away from a straight path between said removing means and said guide means as a function of the distance between said removing means and said guide means thereby maintaining the length of wire between said removing means and said bobbin constant.

3. An apparatus for continuously winding wire coated with an insulation from a spool onto an elongated bobbin having a plurality of longitudinally spaced disks; comprising:

winding means for rotating said bobbin;

guide means for guiding the wire onto said bobbin at a controlled pitch; and removing means through which said wire extends between said spool and said guide means, said removing means having actuating means for causing said removing means to remove said insulation from said wire so that lengths of said wire without insulation overlie respective disks when said wire is wound on said bobbin;

wherein a predetermined length of said wire is wrapped around said bobbin between each of said disks, and wherein integer multiples of said predetermined length of wire extends between said removing means and said bobbin so that said wire is being wound over one of said disks at the same time that said removing means removes said insulation from said wire.

4. An apparatus for continuously winding wire coated with an insulation from a spool onto an elongated bobbin having a plurality of longitudinally spaced disks; comprising:

winding means for rotating said bobbin;

guide means for guiding the wire onto said bobbin at a controlled pitch; and removing means through which said wire extends between said spool and said guide means, said removing means having actuating means for causing said removing means to remove said insulation from said wire so that lengths of said wire without insulation overlie respective disks when said wire is wound on said bobbin;

wherein a predetermined length of said wire is wrapped around said bobbin between each of said disks, and integer multiples of said predetermined length of wire extends between said removing means and said bobbin so that said wire is being wound over one of said disks at the same time that said removing means removes said insulation from said wire; and wherein said disks have formed therein respective notches that are aligned with each other, and wherein said guide means further includes a mechanically actuated finger for displacing said wire along the length of said bobbin through a notch when the removing means removes said insulation from said wire.

5. A method of continuously winding wire coated with an insulation from a source of said wire along a guided path onto an elongated bobbin having a plurality of longitudinally spaced disks; said method comprising:

rotating said bobbin;

guiding the wire onto said bobbin by displacing said wire along the length of said bobbin as said bobbin rotates;

periodically removing said insulation from said wire at a removing location along said path that is before said wire is guided onto said bobbin so that predetermined lengths of said wire have said insulation removed, said wire being wound on said bobbin so that lengths of said wire without said insulation overlie respective disk; and, maintaining the length of wire between said bobbin and the removing location constant as said wire is guided onto said bobbin.

6. The method of claim 5 wherein a predetermined length of said wire is wrapped around said bobbin between each of said disks, and wherein integer multiples of said predetermined length of wire extends between said bobbin and the removing location so that said wire is being wound over one of said disks at the same time that said wire is being removed.

7. The method of claim 6 further including the step of simultaneously slowing the winding of said wire while said wire is being wound over each of said disks thereby facilitating the winding of said wire over said disks.

* * * * *